United States Patent
Yu et al.

(10) Patent No.: US 9,776,216 B2
(45) Date of Patent: Oct. 3, 2017

(54) DISPENSING APPARATUS AND DISPENSING METHOD

(71) Applicant: TAIWAN SEMICONDUCTOR MANUFACTURING CO., LTD., Hsinchu (TW)

(72) Inventors: Weibo Yu, Hsinchu (TW); Kuo-Sheng Chuang, Hsinchu (TW); Wen-Yu Ku, Hsinchu (TW); Chin-Hsiang Lin, Hsin-chu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 618 days.

(21) Appl. No.: 14/092,533

(22) Filed: Nov. 27, 2013

(65) Prior Publication Data

US 2015/0144161 A1 May 28, 2015

(51) Int. Cl.
*B08B 3/02* (2006.01)
*B08B 17/02* (2006.01)
*H01L 21/67* (2006.01)
*B05B 15/02* (2006.01)

(52) U.S. Cl.
CPC ............ *B08B 3/02* (2013.01); *B05B 15/0258* (2013.01); *B08B 17/025* (2013.01); *H01L 21/67051* (2013.01)

(58) Field of Classification Search
CPC ..... B08B 3/02; B08B 17/025; B05B 15/0258; H01L 21/67051
See application file for complete search history.

(56) References Cited

U.S. PATENT DOCUMENTS

| | | | |
|---|---|---|---|
| 5,941,456 A * | 8/1999 | Waryu | B05B 1/3006 239/112 |
| 2007/0141849 A1 * | 6/2007 | Kanno | B01F 3/04049 438/745 |
| 2007/0169793 A1 * | 7/2007 | Shimada | H01L 21/67023 134/26 |
| 2008/0055575 A1 * | 3/2008 | Nagasaka | G03F 7/70341 355/30 |
| 2010/0112917 A1 * | 5/2010 | Leighton | B24B 57/02 451/446 |

* cited by examiner

*Primary Examiner* — Michael Barr
*Assistant Examiner* — Benjamin L Osterhout
(74) *Attorney, Agent, or Firm* — McDermott Will & Emery LLP (57) ABSTRACT

A dispensing method is disclosed that includes the following steps: a cleaning sleeve is provided to surround a spray member. A first fluid is previously dispensed from a first fluid outlet of the spray member. A second fluid is sprayed from a second fluid outlet of the cleaning sleeve to clean the spray member. The cleaning sleeve is opened or slid away from the spray member, such that the first fluid outlet of the spray member is exposed to a substrate. The first fluid is dispensed from the first fluid outlet of the spray member to the substrate.

20 Claims, 12 Drawing Sheets

DISPENSING APPARATUS AND DISPENSING METHOD

FIELD

The present disclosure relates to a dispensing apparatus and a dispensing method.

BACKGROUND

Two different kinds of conventional chemical dispensing systems are used to clean wafers. A conventional chemical dispensing system may include a single nozzle and a movable arm. The single nozzle is mounted onto the movable arm. In operation, the single nozzle can previously dispense a chemical fluid at a home position away from a stage to prevent the aging effect of the chemical fluid. Thereafter, the single nozzle moves with the movable arm above a wafer supported by the stage, and dispenses the chemical fluid onto the wafer for cleaning.

However, when the single nozzle previously dispenses the chemical fluid, the pre-dispensed chemical fluid may pollute the movable arm. Since the conventional chemical dispensing system only has the single nozzle, it is difficult to evenly dispense the chemical fluid on the wafer, and the particles on the wafer cannot be cleaned uniformly. Moreover, the nozzle does not have self-clean functions, such that the chemical dispensing system needs to be stopped for cleaning the nozzle. As a result, the production capacity and the yield rate of the wafer are difficult to be improved.

Another conventional chemical dispensing system may include a dispensing bar above a stage and a dispensing head. The dispensing bar is connected the dispensing head. When the dispensing bar previously dispenses the chemical fluid to prevent the aging effect of the chemical fluid, the chemical fluid may be poured onto the chuck and then damage the chuck and the motor of the stage. If the dispensing bar does not previously dispense the chemical fluid, the aging effect of the chemical fluid may cause particle issues and etching rate drift in following process steps. Therefore, a dummy wafer for protecting the stage is required, but the productivity of the chemical dispensing system is reduced.

Moreover, the dispensing bar does not have self-clean functions, such that the chemical dispensing system needs to be stopped for cleaning the dispensing bar. As a result, the production capacity and the yield rate of the wafer are difficult to be improved.

BRIEF DESCRIPTION OF THE DRAWINGS

The disclosure can be more fully understood by reading the following detailed description of various embodiments, with reference to the accompanying drawings as follows.

DETAILED DESCRIPTION

In the following description, specific details are presented to provide a thorough understanding of the embodiments of the present disclosure. Persons of ordinary skill in the art will recognize, however, that the present disclosure can be practiced without one or more of the specific details, or in combination with other components. Well-known implementations or operations are not shown or described in detail to avoid obscuring aspects of various embodiments of the present disclosure.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

It will be understood that, although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

As used herein, the terms "comprising," "including," "having," "containing," "involving," and the like are to be understood to be open-ended, i.e., to mean including but not limited to.

Reference throughout the specification to "one embodiment" or "an embodiment" means that a particular feature, structure, implementation, or characteristic described in connection with the embodiment is included in at least one embodiment of the present disclosure. Thus, uses of the phrases "in one embodiment" or "in an embodiment" in various places throughout the specification are not necessarily all referring to the same embodiment. Furthermore, the particular features, structures, implementation, or characteristics may be combined in any suitable manner in one or more embodiments.

Figure 1:
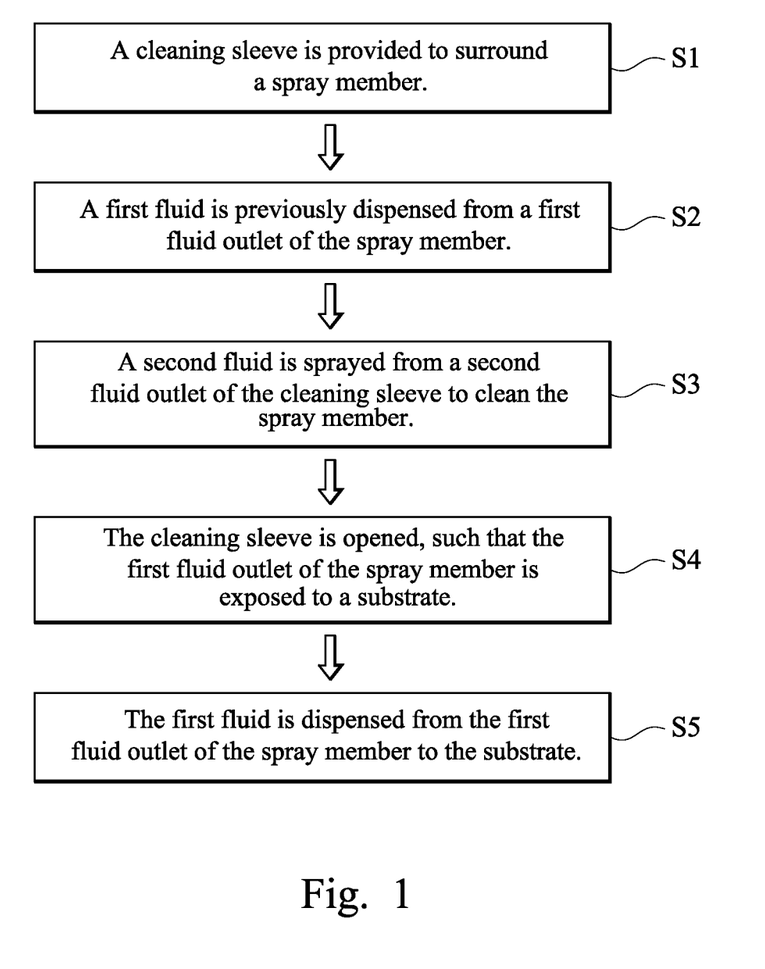
FIG. 1 is a flow chart of a dispensing method in accordance with some embodiments of the present disclosure.

FIG. 1 is a flow chart of a dispensing method in accordance with some embodiments of the present disclosure. As shown in FIG. 1, in step S1, a cleaning sleeve is provided to surround a spray member. Next in step S2, a first fluid is previously dispensed from a first fluid outlet of the spray member. Thereafter in step S3, a second fluid is sprayed from a second fluid outlet of the cleaning sleeve to clean the spray member. Next in step S4, the cleaning sleeve is opened, such that the first fluid outlet of the spray member is exposed to a substrate. Finally in step S5, the first fluid is dispensed from the first fluid outlet of the spray member to the substrate.

In the following description, the aforesaid dispensing method will be described in detail.

Figure 2:
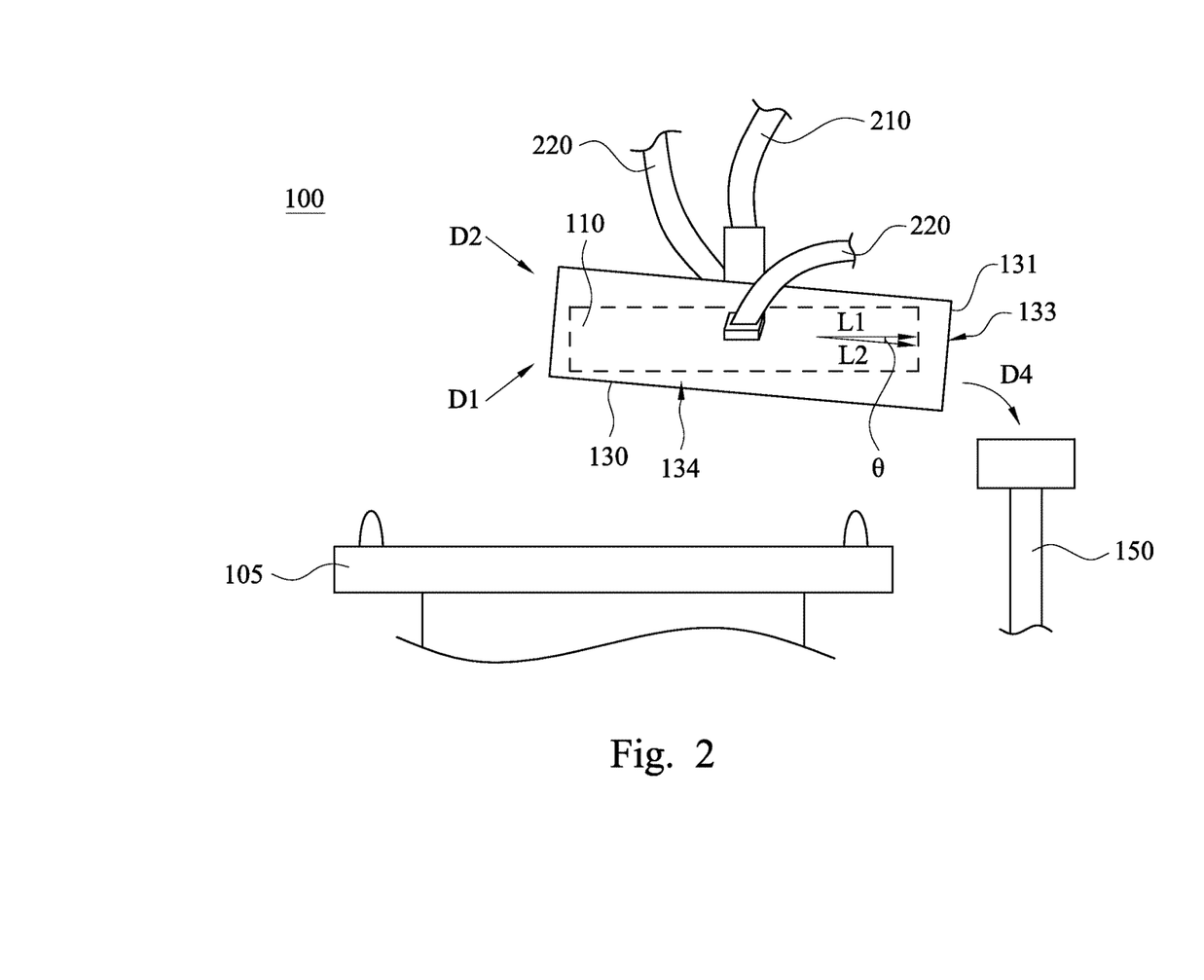
FIG. 2 is a side view of a dispensing apparatus when a cleaning sleeve is in a closing state in accordance with some embodiments of the present disclosure.

FIG. 2 is a side view of a dispensing apparatus 100 when a cleaning sleeve 130 is in a closing state in accordance with some embodiments of the present disclosure. As shown in FIG. 2, the dispensing apparatus 100 includes a stage 105, a spray member 110, and the cleaning sleeve 130. The stage 105 is used to support a substrate 300 (see FIG. 5). The spray member 110 is located above the stage 105. The cleaning sleeve 130 is detachably connected on the outer surface of the spray member 110. Moreover, in some embodiments, the cleaning sleeve 130 is obliquely arranged relative to the spray member 110, such that an acute included angle θ is formed between the lengthwise direction L1 of the spray member 110 and the lengthwise direction L2 of the cleaning sleeve 130.

When the cleaning sleeve 130 is in the closing state, the cleaning sleeve 130 surrounds the spray member 110, such that an accommodating space 134 is formed between the cleaning sleeve 130 and the spray member 110. An end portion 131 of the cleaning sleeve 130 has an opening 133, and the opening 133 of the cleaning sleeve 130 is communicated with the accommodating space 134. In some embodiments, the dispensing apparatus 100 further includes a fluid collector 150. The fluid collector 150 is under and adjacent to the opening 133 of the cleaning sleeve 130. When a fluid is in the accommodating space 134, the fluid flows along the lengthwise direction L2 of the cleaning sleeve 130 due to gravity. As a result, the fluid can flow out from the opening 133 of the cleaning sleeve 130 and drop into the fluid collector 150.

The structures of the spray member 110 and the cleaning sleeve 130 will be described in the following description.

Figure 3:
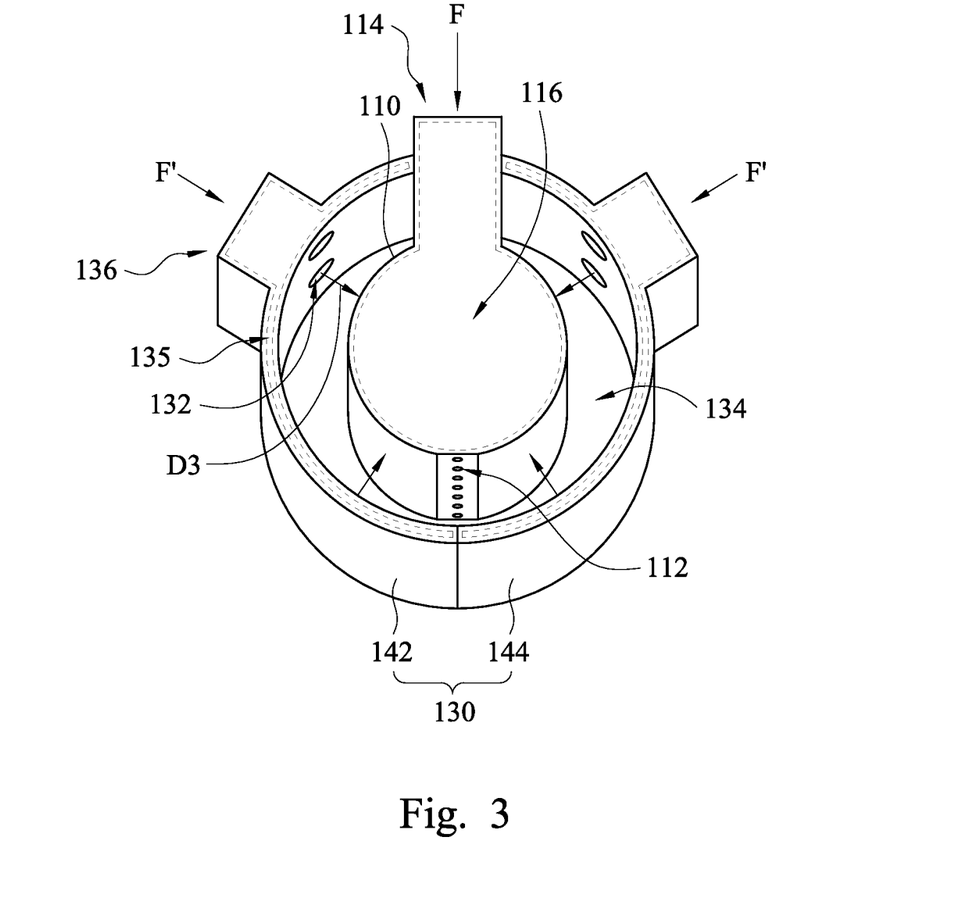
FIG. 3 is a partial perspective view of a spray member and the cleaning sleeve shown in FIG. 1, in which the perspective view is from a direction D1.
Figure 4:
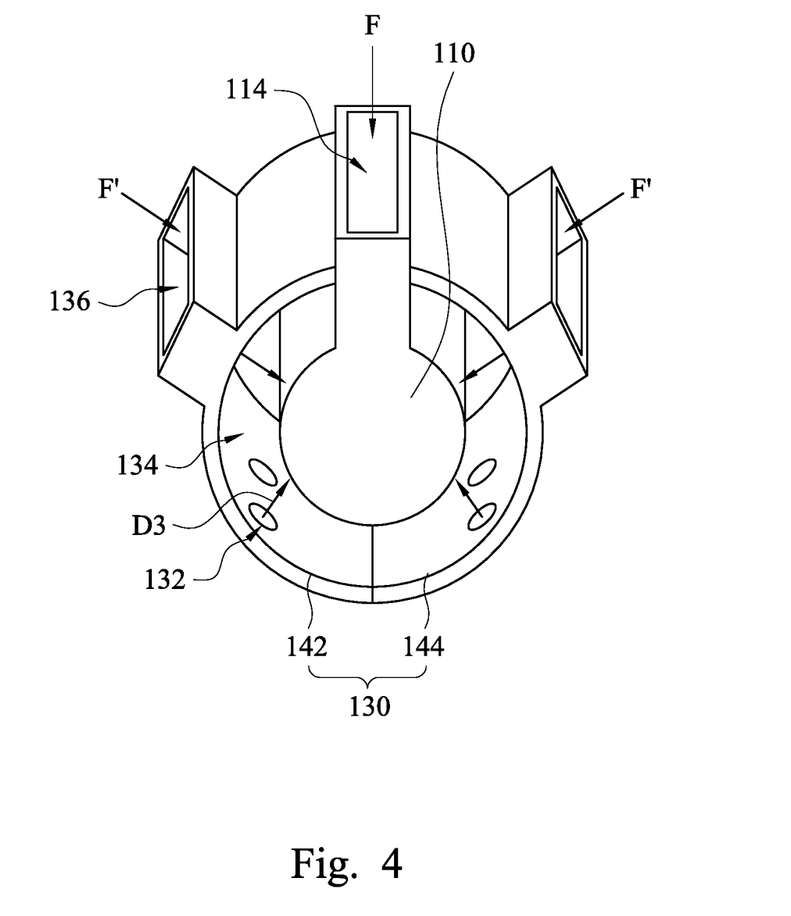
FIG. 4 is a partial perspective view of the spray member and the cleaning sleeve shown in FIG. 1, in which the perspective view is from a direction D2.

FIG. 3 is a partial perspective view of the spray member 110 and the cleaning sleeve 130 shown in FIG. 1, in which the perspective view is from a direction D1. FIG. 4 is a partial perspective view of the spray member 110 and the cleaning sleeve 130 shown in FIG. 1, in which the perspective view is from a direction D2. As shown in FIG. 3 and FIG. 4, the spray member 110 has at least one first fluid outlet 112, a first fluid inlet 114, and a first inner space 116 therein. The first fluid outlet 112 and the first fluid inlet 114 are communicated with the first inner space 116, and the first fluid inlet 114 of the spray member 110 faces away from the accommodating space 134. The first fluid inlet 114 is connected to a first fluid pipe 210 (referring to FIG. 2), such that the first fluid pipe 210 can provide a first fluid F to enter the first fluid inlet 114 of the spray member 110. As a result, the first fluid F can pass the first inner space 116 and spray from the first fluid outlet 112.

Furthermore, the cleaning sleeve 130 has at least one second fluid outlet 132, a second fluid inlet 136, and a second inner space 135 therein. The second fluid inlet 136 and the second fluid outlet 132 are communicated with the second inner space 135, and the second fluid inlet 136 of the cleaning sleeve 130 faces away from the accommodating space 134. The second fluid inlet 136 is connected to a second fluid pipe 220, such that the second fluid pipe 220 can provide a second fluid F' to enter the second fluid inlet 136 of the cleaning sleeve 130. Moreover, the second fluid outlet 132 faces the spray member 110. As a result, the second fluid F' can pass the second inner space 135 and spray from the second fluid outlet 132 in a direction D3 that is a direction toward the spray member 110.

In some embodiments, the cleaning sleeve 130 includes a first sub-portion 142 and a second sub-portion 144 that are detachably connected with each other to surround the outer surface of the spray member 110. Each of the first sub-portion 142 and the second sub-portion 144 has the second fluid outlet 132, the second inner space 135 and the second fluid inlet 136.

As shown in FIG. 2 and FIG. 3, when the cleaning sleeve 130 is in the closing state, the first sub-portion 142 and the second sub-portion 144 are assembled, such that the cleaning sleeve 130 surrounds the spray member 110 so as to shield the first fluid outlet 112 from the stage 105, and the second fluid outlet 132 faces the spray member 110.

The first fluid F (e.g., chemical fluid) can be previously dispensed from the first fluid outlet 112 of the spray member 110. Thereafter, the pre-dispensed first fluid F can flow along the cleaning sleeve 130 to the fluid collector 150 that is under and adjacent to the opening 133 of the cleaning sleeve 130. That is to say, the first fluid F can drop in a direction D4 from the accommodating space 134. As a result, the pre-dispensed first fluid F can be drained by the fluid collector 150 that may include a pump.

Therefore, the dispensing apparatus 100 and the dispensing method have pre-dispensing function, such that the dispensing apparatus 100 and the dispensing method can prevent the aging effect of the first fluid F to decrease the particles and the etching rate drift of the substrate (see FIG. 5) in following process steps.

As shown in FIG. 2 and FIG. 4, after the first fluid F is previously dispensed from the first fluid outlet 112 and the pre-dispensed first fluid F flows to the fluid collector 150, the second fluid F' (e.g., DIW and N2) can be sprayed from the second fluid outlet 132 of the cleaning sleeve 130 to clean the spray member 110. Thereafter, the sprayed second fluid F' can also flow along the cleaning sleeve 130 to the fluid collector 150. That is to say, the second fluid F' can drop in the direction D4 from the accommodating space 134 to the fluid collector 150. As a result, the sprayed second fluid F' can be drained by the fluid collector 150 and not sprayed onto the stage 105.

Therefore, the dispensing apparatus 100 and the dispensing method have self-clean function, the dispensing apparatus 100 does not need to be stopped for cleaning the spray member 110. As a result, the production capacity and the yield rate of the substrate 300 (see FIG. 5) cleaned by the dispensing apparatus 100 and the dispensing method can be improved.

Figure 5:
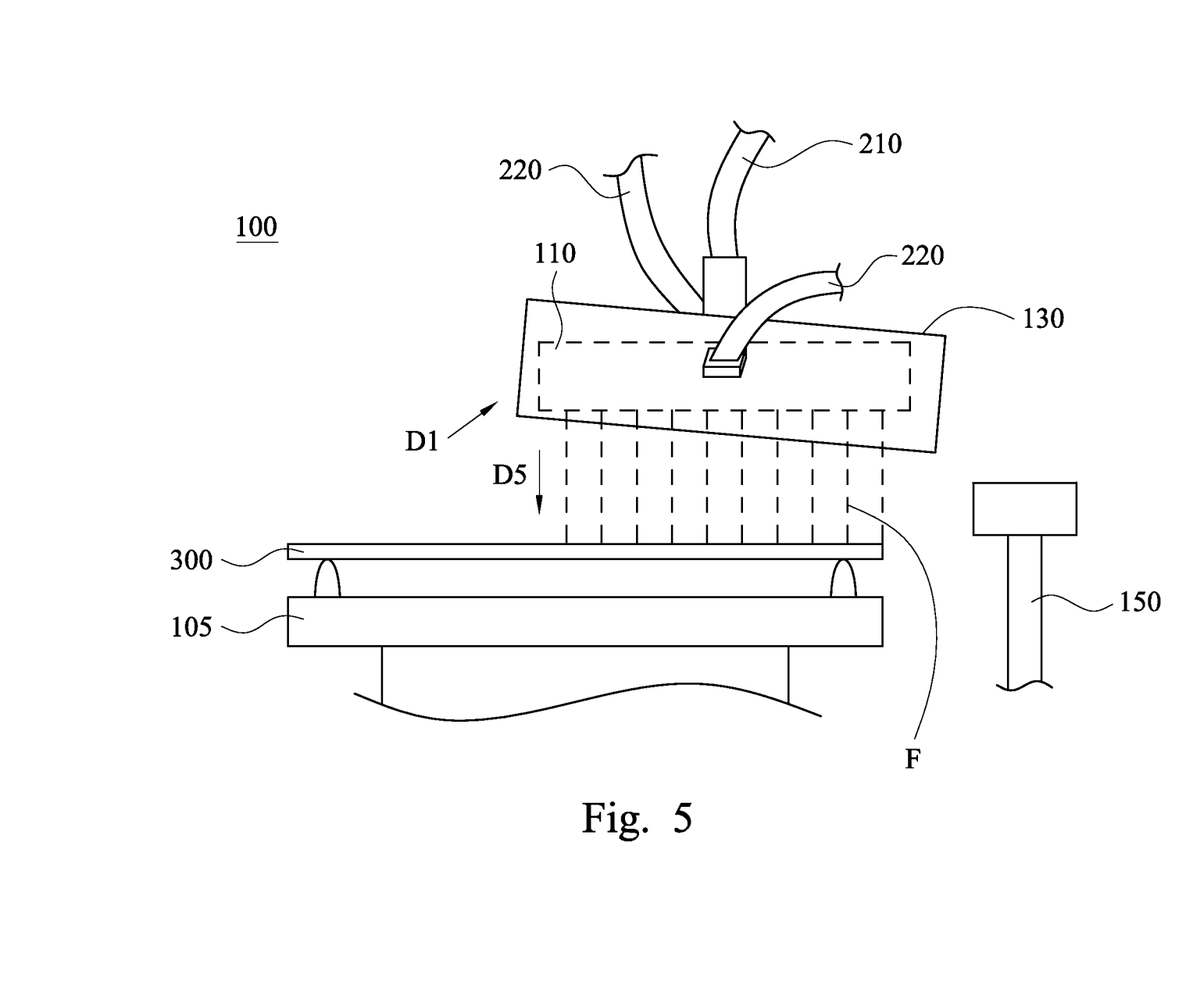
FIG. 5 is a side view of the dispensing apparatus when the cleaning sleeve is in an opening state in accordance with some embodiments of the present disclosure.
Figure 6:
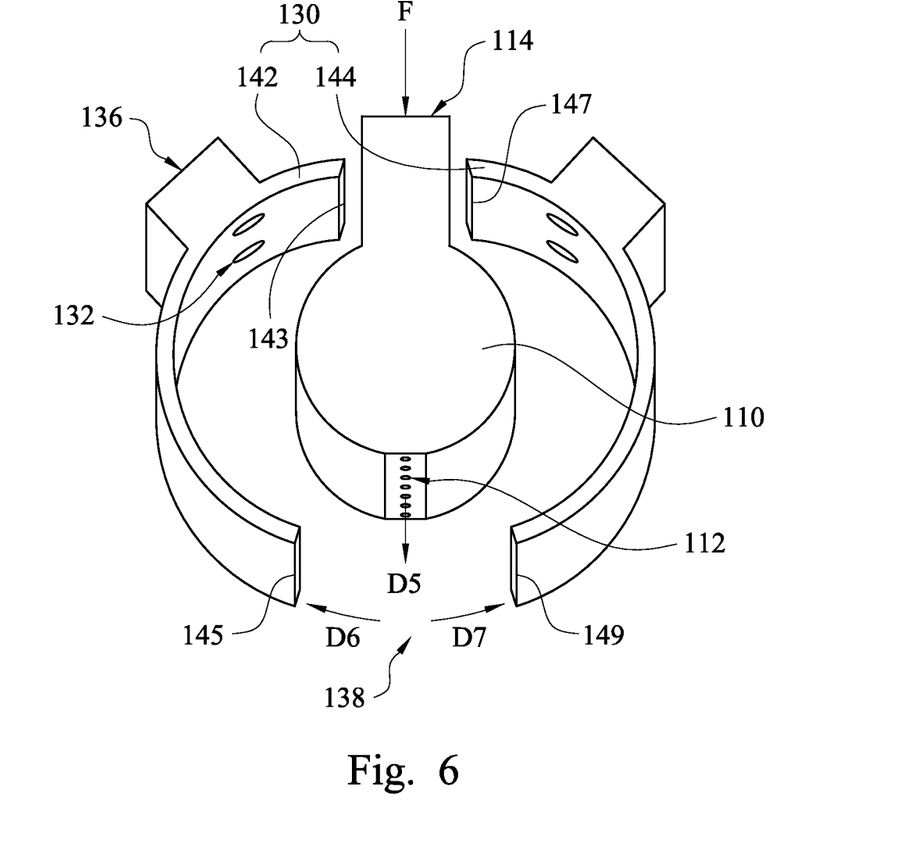
FIG. 6 is a partial perspective view of the spray member and the cleaning sleeve shown in FIG. 5, in which the perspective view is from the direction D1.

FIG. 5 is a side view of the dispensing apparatus 100 when the cleaning sleeve 130 is in an opening state in accordance with some embodiments of the present disclosure. FIG. 6 is a partial perspective view of the spray member 110 and the cleaning sleeve 130 shown in FIG. 5, in which the perspective view is from the direction D1. As shown in FIG. 5 and FIG. 6, after the spray member 110 is cleaned by the second fluid F', the stage 105 can be load the substrate 300. The substrate 300 may be, but not limited to, a wafer, a thin film transistor (TFT) device, or a light emitting diode (LED) device.

When the cleaning sleeve 130 is in the opening state, the first sub-portion and 142 the second sub-portion 144 are detached from each other, such that the first sub-portion 142 and the second sub-portion 144 of the cleaning sleeve 130 are opened to form an opening groove 138 to expose the first fluid outlet 112 to the stage 105, such that the first fluid outlet 112 is exposed to the substrate 300. As a result, the first fluid F can be dispensed from the first fluid outlet 112 of the spray member 110 to the substrate 300 in a direction D5. Since the first fluid F is fresh and the spray member 110 is already cleaned by the cleaning sleeve 130, the particles and the etching rate drift of the substrate 300 can be prevented.

In some embodiments, the first sub-portion 142 has a first edge 143 and a second edge 145, and the first edge 143 of the first sub-portion 142 is detachably connected on the outer surface of the spray member 110. The second sub-portion 144 has a third edge 147 and a fourth edge 149, and the third edge 147 of the second sub-portion 144 is detachably connected on the outer surface of the spray member 110. The opening groove 138 is formed between the second edge 145 of the first sub-portion 142 and the fourth edge 149 of the second sub-portion 144. When the cleaning sleeve 130 is opened, the second edge 145 of the first sub-portion 142 and the fourth edge 149 of the second sub-portion 144 are respectively moved toward a direction D6 and a direction D7.

As shown in FIG. 3 and FIG. 6, after the first fluid F is dispensed from the first fluid outlet 112 of the spray member 110 to the substrate 300, the first sub-portion 142 and the second sub-portion 144 of the cleaning sleeve 140 closes the opening groove 138 to be in the closing state. In some embodiments, the cleaning sleeve 130 is closed toward the spray member 110 to surround the spray member 110, such that the cleaning sleeve 130 shields the first fluid outlet 112 from the stage 105. Thereafter, the second fluid F' may be sprayed from the second fluid outlet 132 of the cleaning sleeve 130 to clean the spray member 110 again.

It is to be noted that the connection relationships of the elements described above will not be repeated in the following description.

Figure 7:
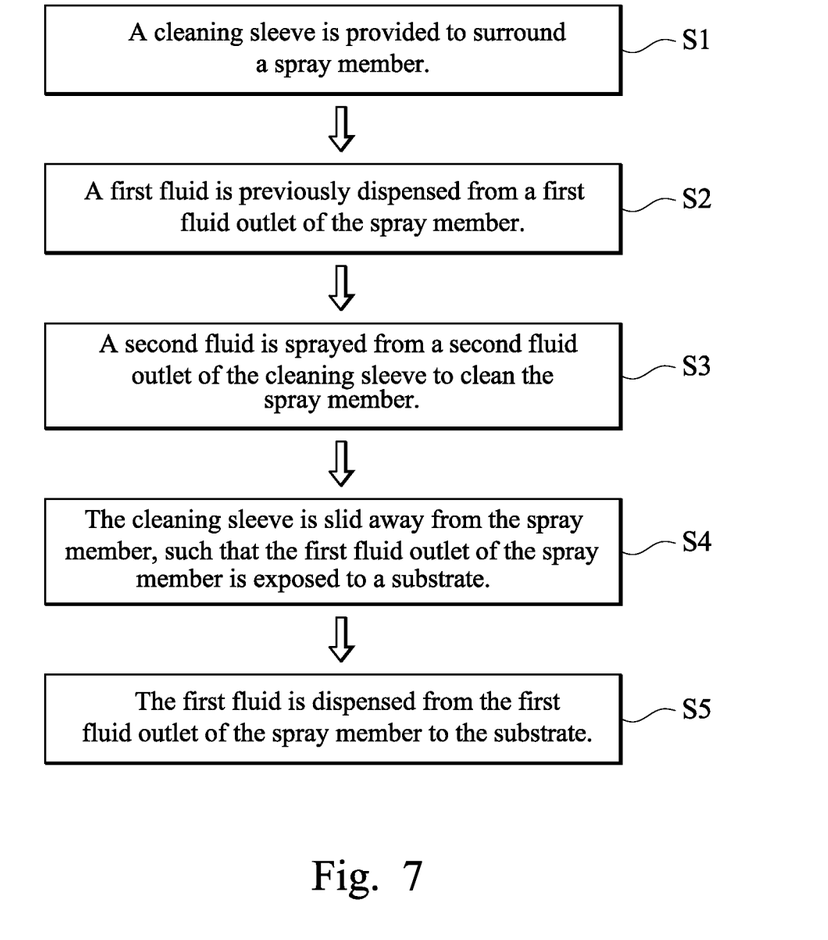
FIG. 7 is a flow chart of a dispensing method in accordance with some embodiments of the present disclosure.

FIG. 7 is a flow chart of a dispensing method in accordance with some embodiments of the present disclosure. As shown in FIG. 7, in step S1, a cleaning sleeve is provided to surround a spray member. Next in step S2, a first fluid is previously dispensed from a first fluid outlet of the spray member. Thereafter in step S3, a second fluid is sprayed from a second fluid outlet of the cleaning sleeve to clean the spray member. Next in step S4, the cleaning sleeve is slid away from the spray member, such that the first fluid outlet of the spray member is exposed to a substrate. Finally in step S5, the first fluid is dispensed from the first fluid outlet of the spray member to the substrate.

In the following description, the aforesaid dispensing method will be described in detail.

Figure 8:
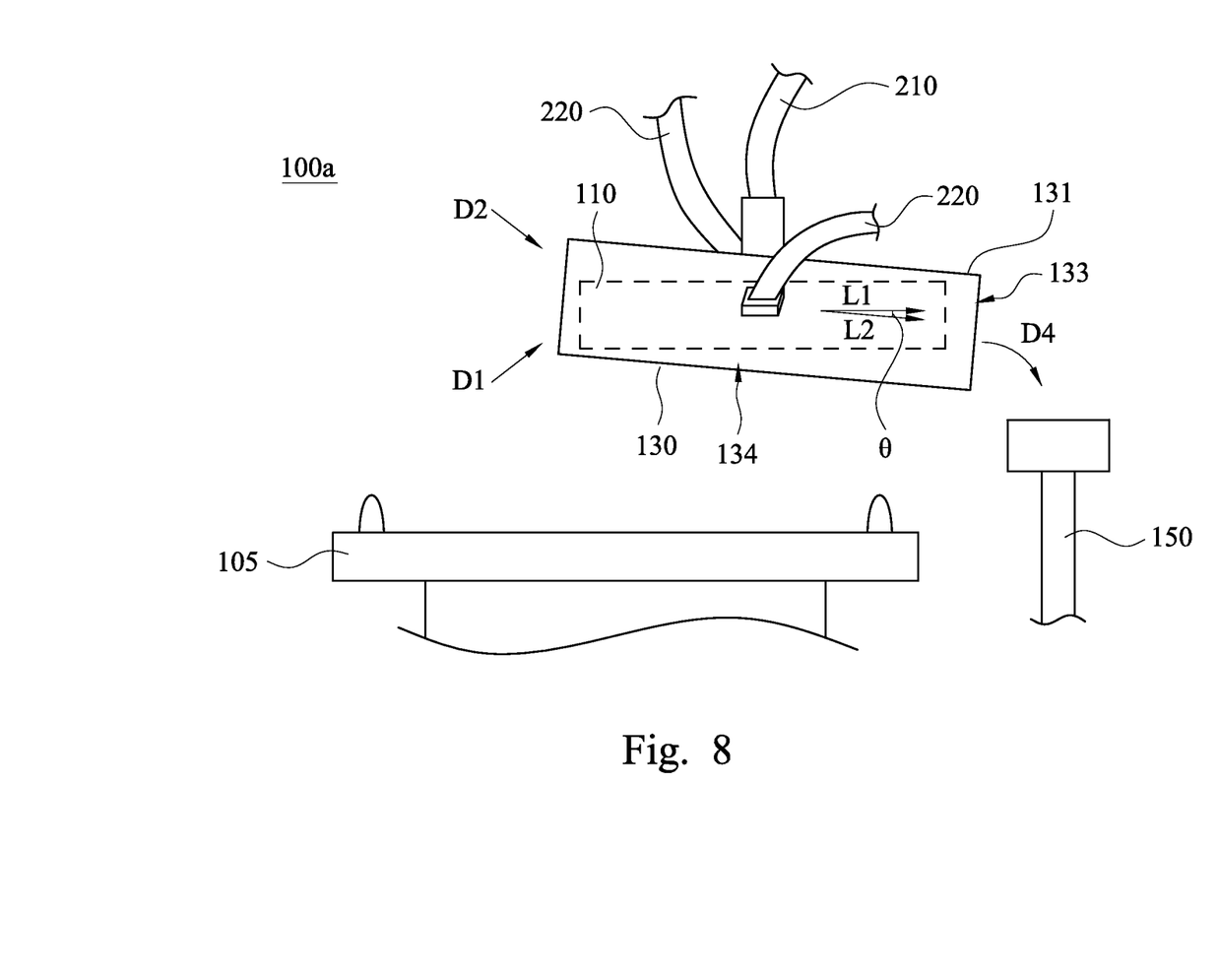
FIG. 8 is a side view of a dispensing apparatus when a cleaning sleeve surrounding a spray member in accordance with some embodiments of the present disclosure.
Figure 9:
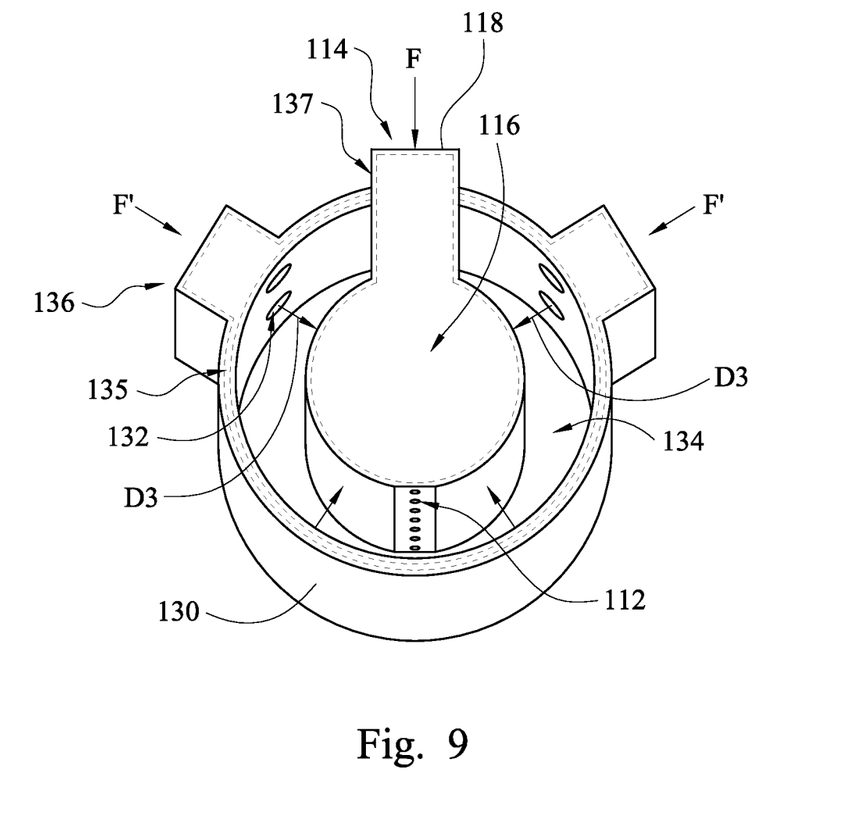
FIG. 9 is a partial perspective view of the spray member and the cleaning sleeve shown in FIG. 8, in which the perspective view is from the direction D1.

FIG. 8 is a side view of a dispensing apparatus 100a when a cleaning sleeve 130 surrounding a spray member 110 in accordance with some embodiments of the present disclosure. FIG. 9 is a partial perspective view of the spray member 110 and the cleaning sleeve 130 shown in FIG. 8, in which the perspective view is from the direction D1. As shown in FIG. 8 and FIG. 9, the dispensing apparatus 100a includes the stage 105, the spray member 110, and the cleaning sleeve 130. The difference between this embodiment and the embodiment show in FIG. 2 and FIG. 3 is that the cleaning sleeve 130 is connected on the outer surface of the spray member 110 in a telescoping manner. Moreover, the cleaning sleeve 130 is integrated formed as a single piece, and the cleaning sleeve 130 has only one second inner space 135 communicated with the second fluid inlet 136 and the second fluid outlet 132.

When the cleaning sleeve 130 slides toward the spray member 110 to surround the spray member 110 (as shown in FIG. 1, and FIG. 2), the accommodating space 134 is formed between the cleaning sleeve 130 and the spray member 110, and the acute included angle θ is formed between the lengthwise direction L1 of the spray member 110 and the lengthwise direction L2 of the cleaning sleeve 130.

Figure 10:
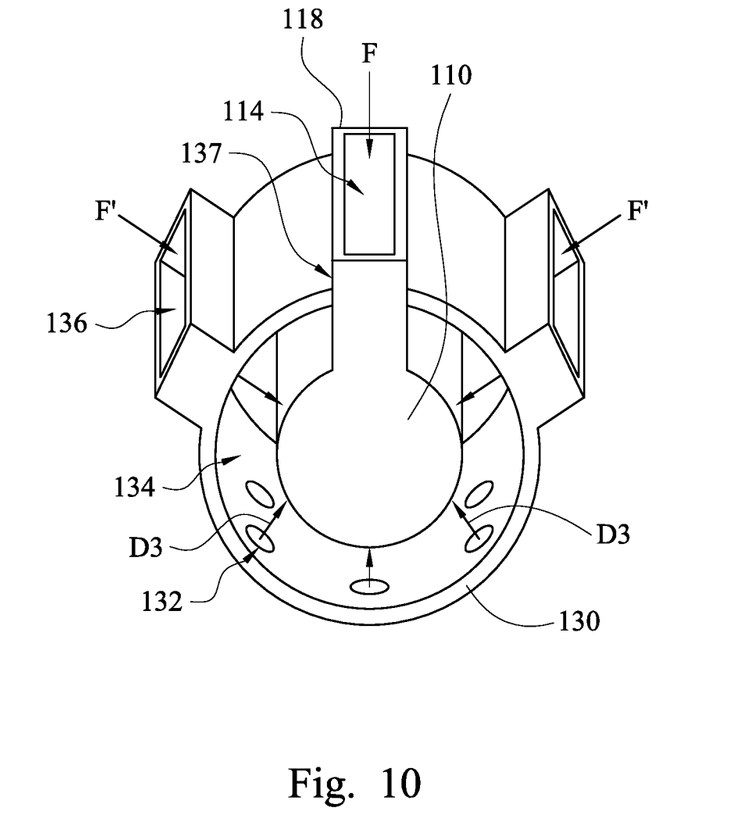
FIG. 10 is a partial perspective view of the spray member and the cleaning sleeve shown in FIG. 8, in which the perspective view is from the direction D2.

FIG. 10 is a partial perspective view of the spray member 110 and the cleaning sleeve 130 shown in FIG. 8, in which the perspective view is from the direction D2. As shown in FIG. 9 and FIG. 10, the first fluid F provided from the first fluid inlet 114 can pass the first inner space 116 and spray from the first fluid outlet 112. The second fluid F' provided from the second fluid inlet 136 can pass the second inner space 135 and spray from the second fluid outlet 132 in the direction D3 that is a direction toward the spray member 110.

As shown in FIG. 8 and FIG. 9, when the cleaning sleeve 130 slides toward the spray member 110, the cleaning sleeve 130 surrounds the spray member 110. The first fluid F (e.g., chemical fluid) can be previously dispensed from the first fluid outlet 112 of the spray member 110. Thereafter, the pre-dispensed first fluid F can flow along the cleaning sleeve 130 to the fluid collector 150 that is under and adjacent to the opening 133 of the cleaning sleeve 130. As a result, the pre-dispensed first fluid F can be drained by the fluid collector 150. Therefore, the dispensing apparatus 100a and the dispensing method have pre-dispensing function.

As shown in FIG. 8 and FIG. 10, after the first fluid F is previously dispensed from the first fluid outlet 112 and the pre-dispensed first fluid F flows to the fluid collector 150, the second fluid F' can be sprayed from the second fluid outlet 132 of the cleaning sleeve 130 to clean the spray member 110. Thereafter, the sprayed second fluid F' can also flow along the cleaning sleeve 130 to the fluid collector 150. As a result, the sprayed second fluid F' can be drained by the fluid collector 150. Therefore, the dispensing apparatus 100a and the dispensing method have self-clean function.

Figure 11:
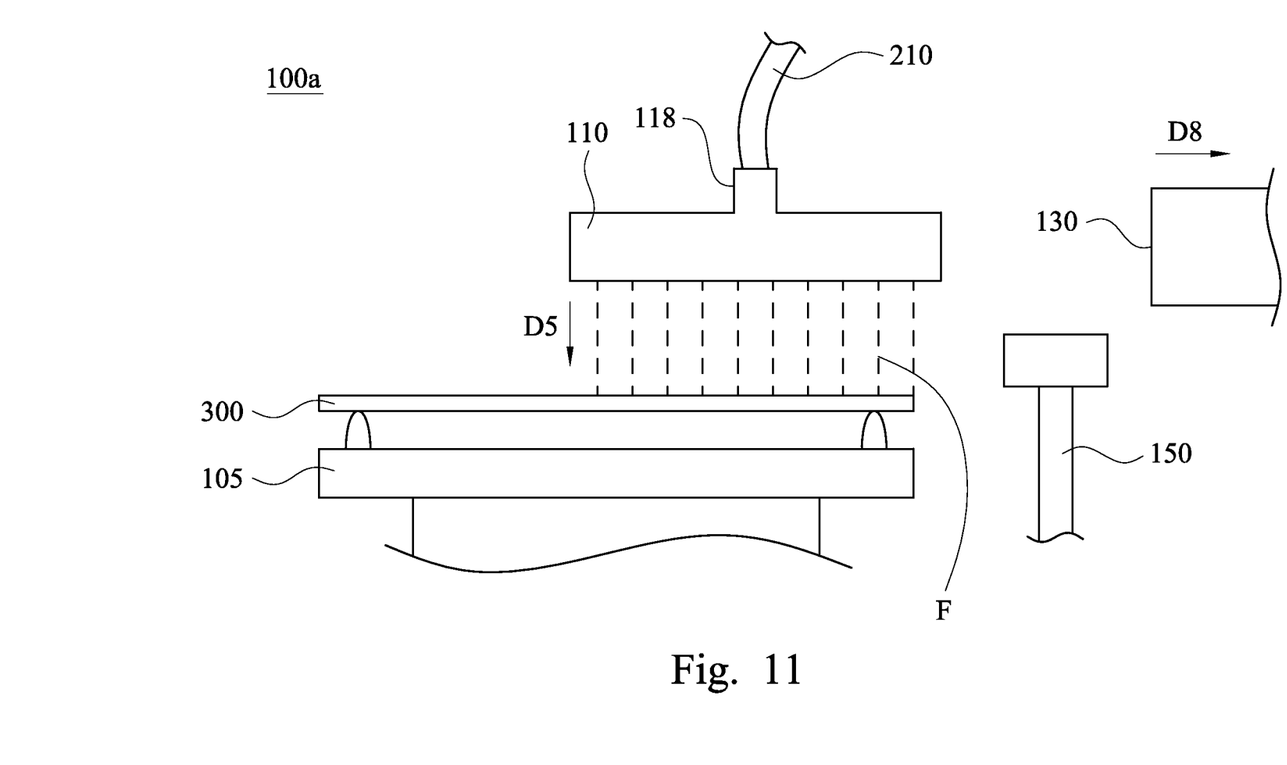
FIG. 11 is a side view of the dispensing apparatus when the cleaning sleeve slides away from the spray member in accordance with some embodiments of the present disclosure.
Figure 12:
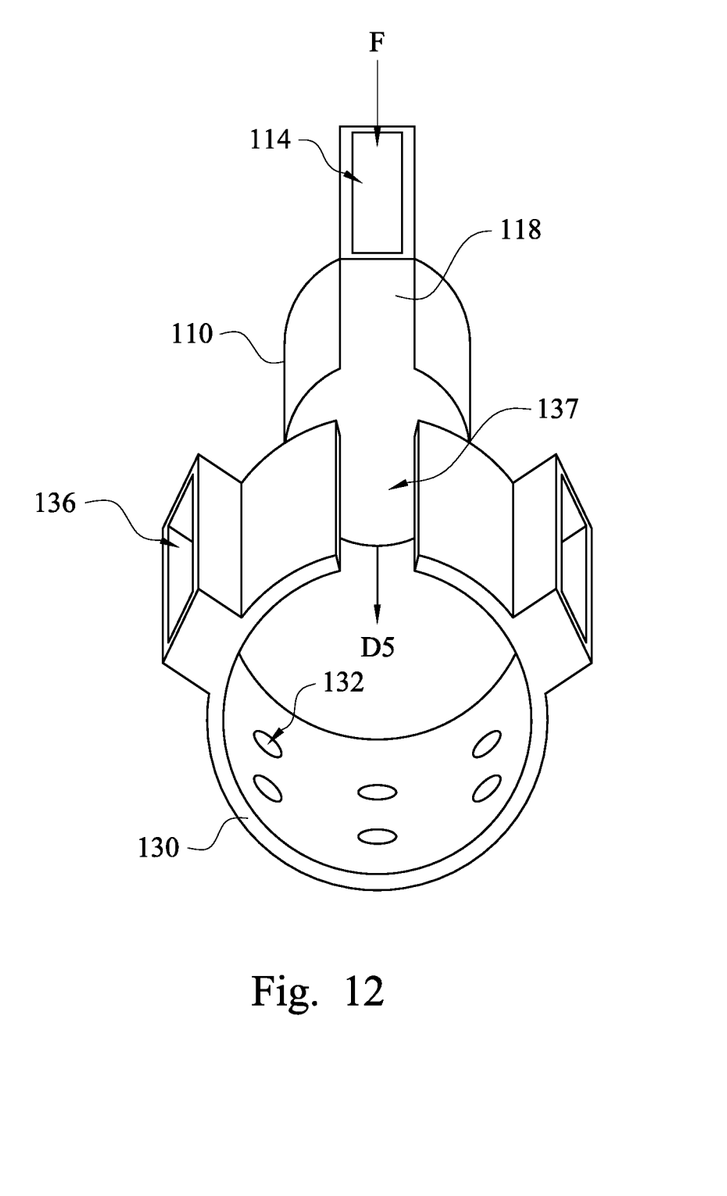
FIG. 12 is a partial perspective view of the spray member and the cleaning sleeve shown in FIG. 11.

FIG. 11 is a side view of the dispensing apparatus 100a when the cleaning sleeve 130 slides away from the spray member 110 in accordance with some embodiments of the present disclosure. FIG. 12 is a partial perspective view of the spray member 110 and the cleaning sleeve 130 shown in FIG. 11. As shown in FIG. 11 and FIG. 12, when the cleaning sleeve 130 slides away from the spray member 110 in a direction D8, the first fluid outlet 112 (see FIG. 9) is exposed to the stage 105. As a result, the first fluid F can be dispensed from the first fluid outlet 112 of the spray member 110 to the substrate 300 in the direction D5. Since the first fluid F is fresh and the spray member 110 is already cleaned by the cleaning sleeve 130, the particles and the etching rate drift of the substrate 300 can be prevented.

In some embodiments, the cleaning sleeve 130 has an opening groove 137, and the spray member 110 has a protruding portion 118. When the cleaning sleeve 130 surrounds the spray member 110, the protruding portion 118 of the spray member 110 is coupled to the opening groove 137 of the cleaning sleeve 130. When the cleaning sleeve 130 slides away from the spray member 110, the opening groove 137 of the cleaning sleeve 130 is separated from the protruding portion 118 of the spray member 110.

As shown in FIG. 9 and FIG. 12, after the first fluid F is dispensed from the first fluid outlet 112 to the substrate 300, the cleaning sleeve 130 slides toward the spray member 110 to surround the spray member 110, such that the cleaning sleeve 130 shields the first fluid outlet 112 from the stage 105 (see FIG. 8). Thereafter, the second fluid F' may be sprayed from the second fluid outlet 132 of the cleaning sleeve 130 to clean the spray member 110 again.

Compared with conventional chemical dispensing systems, the dispensing apparatus and the dispensing method of the present disclosure can previously dispense the first fluid (e.g., chemical fluid), and the pre-dispensed first fluid can flow along the cleaning sleeve to the fluid collector that is under and adjacent to the opening of the cleaning sleeve. Moreover, the dispensing apparatus and the dispensing method can spray the second fluid (e.g., DIW and N2) from the cleaning sleeve to clean the spray member, and the sprayed second fluid can also flow along the cleaning sleeve to the fluid collector that is under and adjacent to the opening of the cleaning sleeve.

That is to say, the dispensing apparatus and the dispensing method have pre-dispensing function, such that the dispensing apparatus and the dispensing method can prevent the aging effect of the first fluid to decrease the particles and the etching rate drift of the substrate in following process steps. Furthermore, the dispensing apparatus and the dispensing method have self-clean function, the dispensing apparatus does not need to be stopped for cleaning the spray member. As a result, the production capacity and the yield rate of the substrate (e.g., wafer) cleaned by the dispensing apparatus and the dispensing method can be improved.

In this document, the term "contact" is also used to indicate the term "via."

In this document, the term "coupled" may also be termed as "electrically coupled", and the term "connected" may be termed as "electrically connected". "Coupled" and "connected" may also be used to indicate that two or more elements cooperate or interact with each other.

The above illustrations include exemplary operations, but the operations are not necessarily performed in the order shown. Operations may be added, replaced, changed order, and/or eliminated as appropriate, in accordance with the spirit and scope of various embodiments of the present disclosure.

In some embodiments, a dispensing apparatus is disclosed that includes a stage for supporting a substrate, a spray member, and a cleaning sleeve. The spray member is located above the stage and has a first fluid outlet. The cleaning sleeve includes a first sub-portion and a second sub-portion that are detachably connected with each other to surround an outer surface of the spray member. The cleaning sleeve has a second fluid outlet. When the first sub-portion and the second sub-portion are detached from each other, the first fluid outlet is exposed to the stage. When the first sub-portion and the second sub-portion are assembled, the cleaning sleeve surrounds the spray member so as to shield the first fluid outlet from the stage, and the second fluid outlet faces the spray member.

Also disclosed is a dispensing apparatus that includes a stage for supporting a substrate, a spray member, and a cleaning sleeve. The spray member is located above the stage and has a first fluid outlet. The cleaning sleeve is connected on an outer surface of the spray member and has a second fluid outlet. When the cleaning sleeve slides away from the spray member, the first fluid outlet is exposed to the stage. When the cleaning sleeve slides toward the spray member to surround the spray member, an accommodating space is formed between the cleaning sleeve and the spray member, and the second fluid outlet faces the spray member.

A dispensing method is also disclosed that includes the operations below. A cleaning sleeve is provided to surround a spray member. A first fluid is previously dispensed from a first fluid outlet of the spray member. A second fluid is sprayed from a second fluid outlet of the cleaning sleeve to clean the spray member. The cleaning sleeve is opened or slid away from the spray member, such that the first fluid outlet of the spray member is exposed to a substrate. The first fluid is dispensed from the first fluid outlet of the spray member to the substrate.

As is understood by one of ordinary skill in the art, the foregoing embodiments of the present disclosure are illustrative of the present disclosure rather than limiting of the present disclosure. It is intended to cover various modifications and similar arrangements included within the spirit and scope of the appended claims, the scope of which should be accorded with the broadest interpretation so as to encompass all such modifications and similar structures.

What is claimed is:

1. A dispensing apparatus, comprising:
   a stage that supports a substrate;
   a spray member located above the stage and having a first fluid outlet; and
   a cleaning sleeve comprising a first sub-portion and a second sub-portion, the cleaning sleeve having a second fluid outlet, wherein
   when the first sub-portion and the second sub-portion are detached from each other, the first fluid outlet is exposed to the stage, and
   when the first sub-portion and the second sub-portion are attached to each other, the cleaning sleeve surrounds the spray member, and at least one portion of the cleaning sleeve is between the first fluid outlet and the stage, and the second fluid outlet faces the spray member.

2. The dispensing apparatus of claim 1, wherein when the first sub-portion and the second sub-portion are attached to each other, an acute angle is formed between a lengthwise direction of the spray member and a lengthwise direction of the cleaning sleeve.

3. The dispensing apparatus of claim 1, wherein when the first sub-portion and the second sub-portion are attached to each other, an accommodating space is formed between the cleaning sleeve and the spray member.

4. The dispensing apparatus of claim 3, wherein an end portion of the cleaning sleeve has an opening communicated with the accommodating space, and the dispensing apparatus further comprises:
   a fluid collector under and adjacent to the opening of the cleaning sleeve.

5. The dispensing apparatus of claim 3, wherein the spray member further has a first inner space therein and a first fluid inlet, the first fluid inlet and the first fluid outlet are communicated with the first inner space.

6. The dispensing apparatus of claim 5, wherein the first fluid inlet of the spray member faces away from the accommodating space.

7. The dispensing apparatus of claim 3, wherein the cleaning sleeve further has a second inner space therein and a second fluid inlet, the second fluid inlet and the second fluid outlet are communicated with the second inner space.

8. The dispensing apparatus of claim 7, wherein the second fluid inlet faces away from of the accommodating space.

9. The dispensing apparatus of claim 1, wherein the first sub-portion has a first edge and a second edge, the second sub-portion has a third edge and a fourth edge, and wherein when the first sub-portion and the second sub-portion are attached to each other, the first edge of the first sub-portion and the third edge of the second sub-portion are on the outer surface of the spray member.

10. The dispensing apparatus of claim 9, wherein when the first sub-portion and the second sub-portion are detached from each other, an opening groove is formed between the second edge of the first sub-portion and the fourth edge of the second sub-portion.

11. A dispensing apparatus comprising:
a stage that supports a substrate;
a spray member located above the stage and having a first fluid outlet; and
a cleaning sleeve detachably connected to an outer surface of the spray member that surrounds the spray member, the cleaning sleeve having a second fluid outlet, wherein
when the cleaning sleeve is detached from the spray member, the first fluid outlet is exposed to the stage;
when the cleaning sleeve surrounds the spray member, at least one portion of the cleaning sleeve is under the first fluid outlet, and the second fluid outlet faces the spray member, and an acute angle is formed between a lengthwise direction of the spray member and a lengthwise direction of the cleaning sleeve.

12. The dispensing apparatus of claim 11, wherein at least a portion of the spray member protrudes outward from the cleaning sleeve when the cleaning sleeve surrounds the spray member.

13. The dispensing apparatus of claim 11, wherein an accommodating space is formed between the cleaning sleeve and the spray member.

14. The dispensing apparatus of claim 13, wherein an end portion of the cleaning sleeve has an opening, and the opening is communicated with the accommodating space.

15. The dispensing apparatus of claim 13, wherein the spray member further has a first inner space therein and a first fluid inlet, the first fluid inlet and the first fluid outlet are communicated with the first inner space.

16. The dispensing apparatus of claim 15, wherein the first fluid inlet of the spray member faces away from of the accommodating space.

17. The dispensing apparatus of claim 13, wherein the cleaning sleeve further has a second inner space therein and a second fluid inlet, the second fluid inlet and the second fluid outlet are communicated with the second inner space.

18. The dispensing apparatus of claim 17, wherein the second fluid inlet faces away from of the accommodating space.

19. The dispensing apparatus of claim 11, wherein the cleaning sleeve has an opening groove, and the spray member has a protruding portion, when the cleaning sleeve surrounds the spray member, the protruding portion is coupled to the opening groove.

20. A dispensing apparatus, comprising:
a stage that supports a substrate;
a spray member located above the stage and having a first fluid outlet; and
a cleaning sleeve detachably connected to an outer surface of the spray member that surrounds the spray member, the cleaning sleeve having a second fluid outlet,
when the cleaning sleeve is detached from the spray member, the first fluid outlet is exposed to the stage;
when the cleaning sleeve surrounds the spray member, the first fluid outlet and the stage are at two opposite sides of the cleaning sleeve, and the second fluid outlet faces the spray member.

* * * * *